US010483438B2

(12) United States Patent
Ootorii

(10) Patent No.: US 10,483,438 B2
(45) Date of Patent: Nov. 19, 2019

(54) COMPONENT, SUBSTRATE MODULE, APPARATUS, AND OPTICAL FILTER

(71) Applicant: SONY CORPORATION, Tokyo (JP)

(72) Inventor: Hiizu Ootorii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/752,271

(22) PCT Filed: Jul. 22, 2016

(86) PCT No.: PCT/JP2016/003430
§ 371 (c)(1),
(2) Date: Feb. 13, 2018

(87) PCT Pub. No.: WO2017/037996
PCT Pub. Date: Mar. 9, 2017

(65) Prior Publication Data
US 2018/0240942 A1 Aug. 23, 2018

(30) Foreign Application Priority Data
Sep. 4, 2015 (JP) .................. 2015-175062

(51) Int. Cl.
H01L 33/48 (2010.01)
H01L 21/52 (2006.01)
(Continued)

(52) U.S. Cl.
CPC ............ H01L 33/486 (2013.01); H01L 21/52 (2013.01); H01L 24/00 (2013.01); H01L 33/44 (2013.01); H01L 33/62 (2013.01); H01L 2224/83 (2013.01); H01L 2933/0066 (2013.01); H01S 5/02268 (2013.01); H01S 5/02272 (2013.01)

(58) Field of Classification Search
CPC ........ H01L 33/486; H01L 33/33; H01L 33/62
See application file for complete search history.

(56) References Cited

U.S. PATENT DOCUMENTS

2005/0194584 A1* 9/2005 Slater, Jr. ............ H01L 21/2654
257/13
2005/0194603 A1* 9/2005 Slater, Jr. .............. H01L 33/405
257/98
2008/0246051 A1 10/2008 Hosokawa et al.

FOREIGN PATENT DOCUMENTS

JP 2008-258459 A 10/2008
JP 2010-171047 A 8/2010
JP 2010-245161 A 10/2010

OTHER PUBLICATIONS

International Search Report and Written Opinion of PCT Application No. PCT/JP2016/003430, dated Oct. 11, 2016, 06 pages.

* cited by examiner

Primary Examiner — Matthew L Reames
(74) Attorney, Agent, or Firm — Chip Law Group

(57) ABSTRACT

A component includes a main body, a first layer, and a second layer. The main body includes a bottom surface. The first layer is provided on the bottom surface of the main body and includes a bottom surface. The second layer is bonded to a metal bonding material on a substrate to be provided physically integrally. The second layer has higher wettability with respect to the metal bonding material in a molten state than the first layer, and protrudes from the bottom surface side of the first layer such that at least a part of the bottom surface of the first layer is exposed on an entire outer circumference side of the second layer.

15 Claims, 12 Drawing Sheets

(51) Int. Cl.
*H01L 33/62* (2010.01)
*H01L 33/44* (2010.01)
*H01L 23/00* (2006.01)
*H01S 5/022* (2006.01)

FIG. 1A
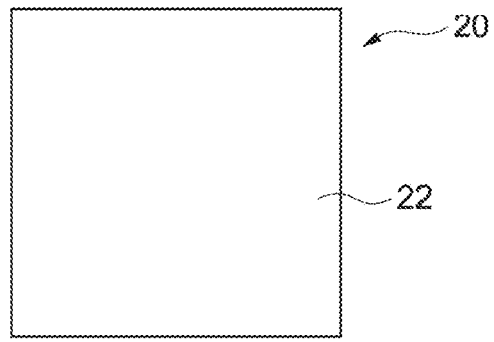
FIG. 1B
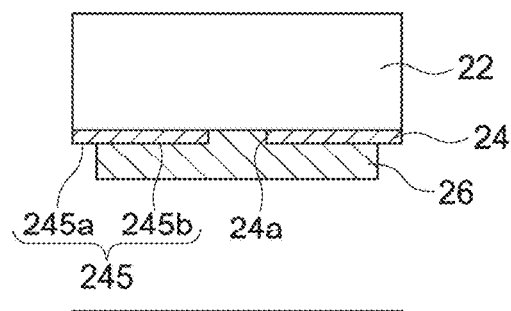
FIG. 1C
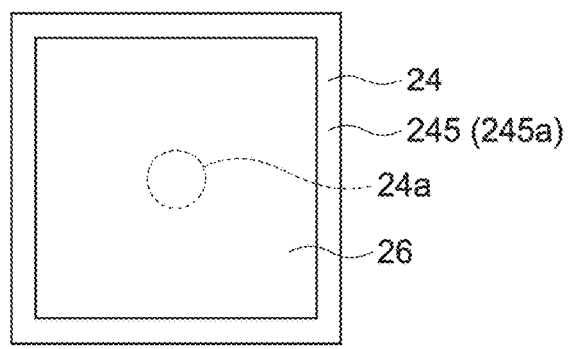
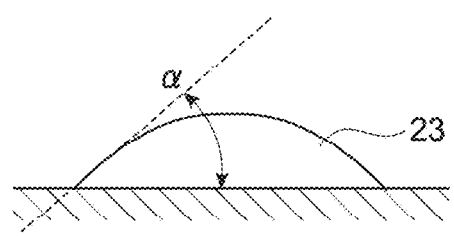
FIG.2

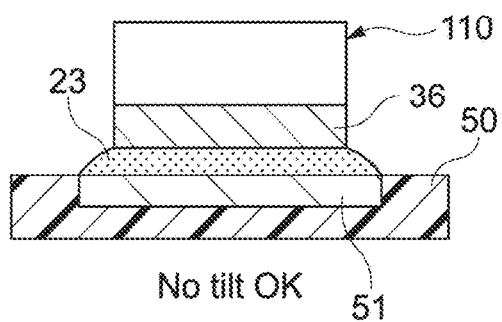
FIG. 5A No tilt OK
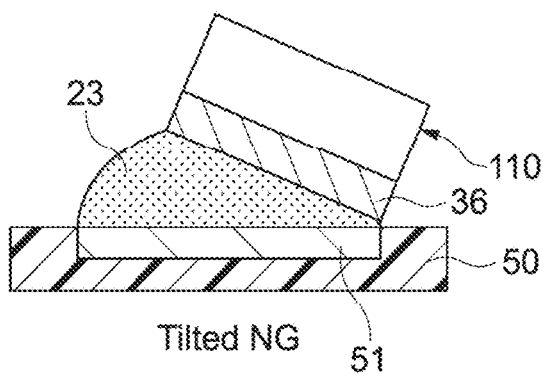
FIG. 5B Tilted NG
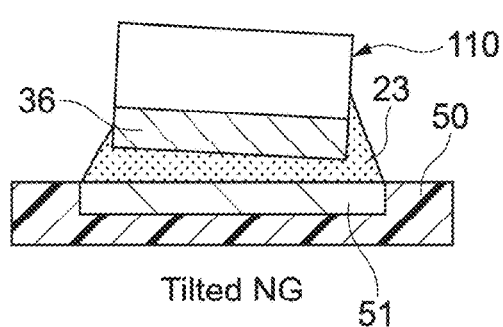
FIG. 5C Tilted NG

COMPONENT, SUBSTRATE MODULE, APPARATUS, AND OPTICAL FILTER

CROSS REFERENCE TO RELATED APPLICATIONS

This application is a U.S. National Phase of International Patent Application No. PCT/JP2016/003430 filed on Jul. 22, 2016, which claims priority benefit of Japanese Patent Application No. JP 2015-175062 filed in the Japan Patent Office on Sep. 4, 2015. Each of the above-referenced Applications is hereby incorporated herein by reference in its entirety.

TECHNICAL FIELD

The present technology relates to a light-emitting device or other components, a substrate module on which this component is mounted, an apparatus including this substrate module, and an optical filter that uses this component.

BACKGROUND ART

Patent Literature 1 discloses a semiconductor device connected to a sub-mount via a solder layer. Electrode layers are respectively provided on upper and lower surfaces of the semiconductor device. The lower-surface-side electrode layer is connected to a metal thin film provided on an upper surface of the sub-mount via the solder layer. Instead of being formed in an entire area of the lower surface of the semiconductor device, the lower-surface-side electrode layer is not formed at end portions of the lower surface in a longitudinal direction, and those end portions of the semiconductor layer are exposed. The solder layer has poor wettability with respect to the semiconductor layer and has favorable wettability with respect to an electrode layer. Therefore, the solder layer does not adhere onto both end portions of the semiconductor device, and a rise of the solder (climb) to side surfaces of the semiconductor device (including the laser emission surface) is prevented from occurring (see, for example, paragraphs [0010], [0017], and [0029] and FIGS. 1A 1B, 1C, 2, and 6 of Patent Literature 1).

An electronic apparatus disclosed in Patent Literature 2 includes an electronic component (semiconductor chip), a printed board on which a noble metal layer is printed, and a solder for bonding them. A back-surface electrode of the semiconductor chip and the noble metal layer of the printed board are bonded by the solder. The noble metal layer is provided in a continuous annular shape so as to surround a projection area (component projection area) of the semiconductor chip. At the time of solder bonding, the melted solder wettedly spreads along the noble metal layer in a continuous annular shape surrounding an entire outer circumference of the component projection area, so a solder thickness is apt to become uniform at the four corners of the component projection area. Therefore, when the semiconductor chip is mounted, the semiconductor chip is prevented from being tilted (see, for example, paragraphs [0052], [0078], and [0079], and FIGS. 1A, 1B, and 1C of Patent Literature 1).

CITATION LIST

Patent Literature

Patent Literature 1: Japanese Patent Application Laid-open No. 2010-171047
Patent Literature 2: Japanese Patent Application Laid-open No. 2010-245161

DISCLOSURE OF INVENTION

Technical Problem

Even with the technologies as in Patent Literatures 1 and 2 above, it is sometimes difficult to suppress the rise of solder to the device (component) and the tilt with respect to the substrate. Especially, in a case where a size of the component is small, such a problem becomes prominent.

The present disclosure aims at providing a technology with which a tilt of a component to be connected to a substrate can be suppressed.

Solution to Problem

For attaining the object described above, a component according to the present technology includes a main body, a first layer, and a second layer.

The main body includes a bottom surface.

The first layer is provided on the bottom surface of the main body and includes a bottom surface.

The second layer is bonded to a metal bonding material on a substrate to be provided physically integrally. The second layer has higher wettability with respect to the metal bonding material in a molten state than the first layer, and protrudes from the bottom surface side of the first layer such that at least a part of the bottom surface of the first layer is exposed on an entire outer circumference side of the second layer.

Since the wettability of the second layer with respect to the metal bonding material in the molten state is higher than that of the first layer and the bottom surface of the first layer is exposed on the entire outer circumference side of the second layer, a position of a front surface of the metal bonding material is determined such that the front surface of the metal bonding material is formed from the vicinity of a boundary between the first layer and the second layer at the bottom surface of the first layer. Then, the second layer is provided while protruding from the bottom surface side of the first layer. Accordingly, side surfaces of the main body are not wetted by the metal bonding material in the molten state, and an occurrence of a tilt of the component can be suppressed.

The main body is not limited to a material constituted of one type of element and may be formed of a compound or a multilayer material.

The first layer may be configured to have non-wettability with respect to the metal bonding material.

Accordingly, a boundary surface of the metal bonding material is positively formed in the vicinity of a boundary between the second layer having relatively-high wettability and the first layer having non-wettability.

The first layer may include an unexposed bottom surface area covered by the second layer in addition to the exposed bottom surface area.

Regarding the bottom surface of the first layer when seen in a cross section in a lamination direction of the first layer and the second layer, the exposed bottom surface area out of the bottom surface of the first layer may include a first width, and the unexposed bottom surface area may include a second width smaller than the first width.

Accordingly, there is an advantage that, even when a mounting apparatus having relatively-low positioning accuracy is used, it is less likely to be adversely affected by a mounting position deviation.

Regarding the bottom surface of the first layer when seen in a cross section in a lamination direction of the first layer and the second layer, a width of the exposed bottom surface area out of the bottom surface of the first layer may be larger than a protrusion height of the second layer from the bottom surface of the first layer in a protrusion direction.

With the configuration in which the width of the exposed area of the bottom surface of the first layer that is less likely to be wetted by the metal bonding material is larger than the protrusion height of the second layer that is highly likely to be wetted by the metal bonding material as described above, it is possible to further lower the possibility of the side surfaces of the main body being wetted by the metal bonding material.

The main body may include a semiconductor material as a main constituent material, the first layer may be formed of an insulating material, and the second layer may be an electrode.

The first layer may have non-wettability with respect to the metal bonding material.

The first layer may include SiO2, SiN, or a poly-based resin.

At least a bottom surface layer of the second layer may be formed of the Au.

A volume of the Au occupying the second layer may be 3% or less a volume of the metal bonding material.

The second layer may include Pt or Ni.

A substrate module according to the present technology includes the component, the substrate including the bonding layer, and the metal bonding material that connects the component to the bonding layer of the substrate.

A component projection area obtained by projecting the component onto the substrate may be arranged on an inner side than an outer circumferential edge of a contact area where the bonding layer and the metal bonding material come into contact with each other.

Accordingly, by appropriately designing an area of the bonding surface area in accordance with the component projection area, positive positioning and tilt prevention of the component can be realized during melting of the metal bonding material.

The substrate module may further include a film that includes an opening opposing the bonding layer, an opening shape of the opening including protrusions that protrude radially from a center portion. In this case, the metal bonding material may include a planar shape that is provided at the opening of the film and is substantially the same as the opening shape of the opening. The component may be fixed to an area corresponding to the center portion of the metal bonding material, and the protrusions at the opening of the film may be arranged to be substantially equiangular with respect to one another in at least 3 directions while being rotationally symmetric from the center portion, and may each have a shape in which a tip end thereof is arranged on a circumference about the center portion and the protrusion becomes thinner toward the tip end. The metal bonding material provided inside the opening of the film and the bonding layer may be connected to each other.

A thickness of the metal bonding material may be 2 μm or more and ½ or less a width of the second layer of the component.

An apparatus or optical filter according to the present technology includes the substrate module described above.

Advantageous Effects of Invention

As described above, according to the present technology, an occurrence of a tilt of a component with respect to a substrate can be suppressed.

It should be noted that the effects described herein are not necessarily limited, and any effect described in the present disclosure may be obtained.

BRIEF DESCRIPTION OF DRAWINGS

[FIGS. 1A, 1B, and 1C] FIG. 1A is a plan view showing a component according to an embodiment of the present technology. FIG. 1B is a partial cross-sectional diagram thereof, and FIG. 1C is a bottom view thereof.

[FIG. 2] FIG. 2 is a diagram for explaining wettability.

FIGS. 3A, 3B, and 3C are plan views, partial cross-sectional diagram, and bottom view of a light-emitting device, respectively.

FIG. 4A is a cross-sectional diagram of a substrate module including the light-emitting device, and FIG. 4B is a plan view thereof.

[FIGS. 5A, 5B, and 5C] FIGS. 5A, 5B, and 5C each show a substrate module in which a light-emitting device according to a reference example is mounted on a substrate.

FIG. 7 is a diagram for explaining a problem that occurs due to a film of an electrode layer (electrode film) formed on a semiconductor wafer not becoming uniform on a single semiconductor wafer.

FIG. 10 shows a state where the light-emitting device according to Comparative Example 1 is bonded to the substrate by solder reflow.

FIG. 11 shows a state where the light-emitting device according to Comparative Example 2 is bonded to the substrate by solder reflow.

FIG. 12 shows a state where the light-emitting device according to the present technology is bonded to the substrate by solder reflow.

FIG. 13 is a photomicrograph of a substrate module including a solder in which a bridge formed of an AuSn alloy is formed.

FIG. 14 is a graph showing an example of a temperature profile of a reflow process by a Sn-based solder.

FIG. 15 is a graph showing an actual measurement of a relationship between a solder thickness and a tilt of the light-emitting device.

FIG. 16 is a graph showing a relationship between a width of an electrode layer and a tilt of a light-emitting device including that electrode layer.

FIG. 17 is a cross-sectional diagram of a component according to another Embodiment 1 of the present technology.

FIG. 18A is a cross-sectional diagram taken along the line A-A of FIG. 18B, and FIG. 18B is a plan view of a substrate module according to another Embodiment 3.

MODES FOR CARRYING OUT THE INVENTION

Figure 3A:
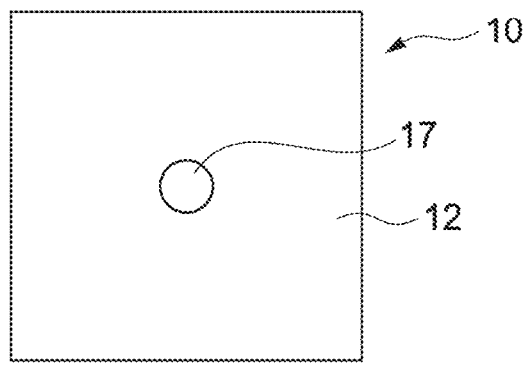
[FIGS. 3A, 3B, and 3C]

Hereinafter, embodiments of the present technology will be described with reference to the drawings.

In descriptions below, when referring to the drawings, the expressions "up", "down", "left", "right", "longitudinal", "lateral", "bottom", and the like are used in some cases for indicating directions and positions of a component and apparatus. However, this is merely a wording for convenience of explanation. In other words, these expressions are often used to make the explanation easier to understand, and sometimes do not coincide with the directions and positions in/at which a device or apparatus is actually manufactured or used.

1. COMPONENT

1.1) Configuration of Component

FIG. 1A is a plan view showing a component according to an embodiment of the present technology. FIG. 1B is a partial cross-sectional diagram thereof, and FIG. 1C is a bottom view thereof. This component 20 is used as one light-emitting device or one component included in an optical filter as will be described later.

The component 20 includes a main body 22, a first layer 24, and a second layer 26. The main body 22 includes an upper surface and a bottom surface. The first layer 24 is provided on the bottom surface of the main body 22. The second layer 26 protrudes from a bottom surface 24$s$ of the first layer 24. An opening 24$a$ is provided at a predetermined position of the first layer 24, at a center, for example, but this is not essential.

The main body 22 is typically formed in a cuboid shape or a cube shape. The main body 22 may be of other prismatic shapes or cylindrical shapes. The shapes of the first layer 24 and the second layer 26 are not limited in particular and only need to be formed in a shape that is the same as or similar to that of the main body 22 and/or a shape close to those shapes when looking at the bottom view shown in FIG. 1C.

The second layer 26 is provided physically integrally. Specifically, the second layer 26 is not provided plurally. In a case where the second layer 26 is an electrode as will be described later, the second layer 26 configures a single electrode (one-sided single electrode).

As shown in FIG. 1C, the second layer 26 is provided so as to protrude downward from the bottom surface 24$s$ of the first layer 24 such that a part of the bottom surface 24$s$ of the first layer 24 is exposed on an entire outer circumference side of the second layer 26. This protrusion direction is not limited to a direction vertical to the bottom surface 24$s$ of the first layer 24 and may be tilted. In this way, the second layer 26 protrudes from the bottom surface 24$s$ of the first layer 24, and the first layer 24 includes an unexposed bottom surface area 24$s$b covered by the second layer 26 in addition to an exposed area 24$s$a out of the bottom surface 24$s$.

This component 20 is connected to a substrate (not shown). Specifically, the second layer 26 is bonded to the substrate via a metal bonding material. A solder is typically used as the metal bonding material as will be described later. The second layer 26 is formed of a material having higher wettability with respect to the metal bonding material than a material of the first layer 24. Typically, the first layer 24 is formed of a material having non-wettability with respect to the metal bonding material.

In the specification, the "wettability" is defined by a contact angle of the metal bonding material in a molten state with respect to a surface of a material (layer) as shown in FIG. 2. When the contact angle α is within the range of 1° to 90°, 1° to 70°, 1° to 60°, or 10° to 50°, the material shows high wettability. When the contact angle α is larger than 90° and smaller than 180°, larger than 70° and smaller than 180°, or larger than 60° and smaller than 180°, the material shows non-wettability.

A relationship of the thicknesses in the longitudinal direction in the figure among the main body 22, the first layer 24, and the second layer 26 becomes main body 22>second layer 26>first layer 24. However, the relationship between these thicknesses can be changed as appropriate on the basis of a type of the component 20.

1.2) Configuration of Component as Light-Emitting Device

Figure 3B:
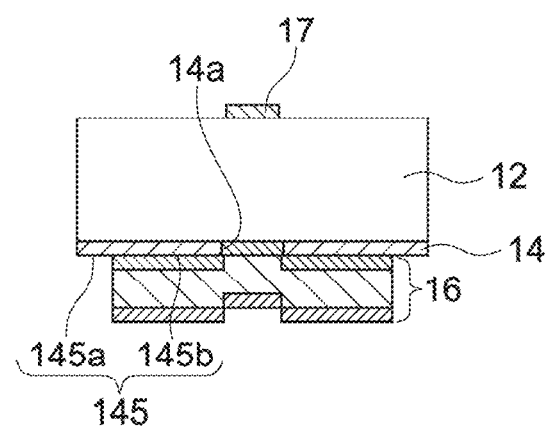
Figure 3C:
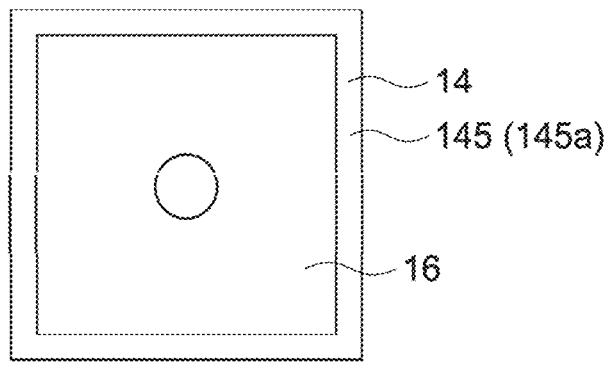

Next, a configuration in a case where the component is a light-emitting device will be described. FIGS. 3A, 3B, and 3C are a plan view, partial cross-sectional diagram, and bottom view of a light-emitting device 10, respectively. The light-emitting device 10 is typically a light-emitting diode, a laser diode, or the like. A basic configuration of the light-emitting device 10 is similar to that of the component 20 described with reference to FIGS. 1A 1B and 1C, so detailed descriptions on similar parts will be simplified or omitted.

As shown in FIG. 3B, the light-emitting device 10 includes a semiconductor layer 12 as the main body, an insulation layer 14 as the first layer, and an electrode layer 16 as the second layer. It should be noted that an upper electrode 17 is connected to an upper portion of the semiconductor layer 12.

Although not shown, the semiconductor layer 12 includes a first-conductivity-type layer constituted of an n- or p-type semiconductor, a second-conductivity-type layer formed of a semiconductor having a conductivity type different from that of the first-conductivity-type layer, and an active layer interposed between those layers. An opening 14$a$ is provided at a predetermined position of the insulation layer 14, at a center, for example. The electrode layer 16 is in contact with the first-conductivity-type layer of the semiconductor layer 12 via the opening 14$a$. The upper electrode 17 is in contact with the second-conductivity-type layer of the semiconductor layer 12.

As described with reference to FIGS. 1A, 1B, and 1C, the electrode layer 16 as the second layer is provided so as to protrude downward from the insulation layer 14 such that a bottom surface 14$s$ of the insulation layer 14 is exposed on an entire outer circumference side of the electrode layer 16. With such a structure, the bottom surface 14$s$ includes an exposed area 14$s$a and an unexposed bottom surface area 14$s$b.

As the material of the semiconductor layer 12, a publicly-known material such as a gallium compound semiconductor and a phosphorus compound semiconductor is used, for example. However, the material is not limited in particular as long as it is capable of emitting light with this structure.

Wettability of the electrode layer 16 with respect to a solder (solder in molten state) as the metal bonding material is higher than that of the insulation layer 14. As described with reference to FIG. 2, the wettability is defined by the contact angle of the metal bonding material in a molten state with respect to the electrode layer 16 and the insulation layer 14.

As the material of the insulation layer 14, for example, $SiO_2$, SiN, $Al_2O_3$, $TiO_2$, TiN, or the like is used. The thickness of the insulation layer 14 is favorably 2 nm or more and 500 nm or less, more favorably 4 nm or more and 250 nm or less. The material of the insulation layer 14 shows non-wettability with respect to the solder. The material of the insulation layer 14 may be, for example, a poly-based resin.

A width of the insulation layer 14 is favorably 5 µm or more and 500 µm or less, more favorably 5 µm or more and 250 µm or less. The "width" refers to a length of one side in a case where an outer shape of the insulation layer 14 is a triangle or a rectangle when seen in a lamination direction of each layer (i.e., seen in plan view as shown in FIGS. 3A and 3C). In a case where the outer shape of the insulation layer 14 is a polygon of a pentagon or more in plan view, the "width" is a length of a longest diagonal line (line connecting vertices of two points). In a case where the outer shape of the insulation layer 14 is a circle or an ellipse, the "width" is a diameter or a major axis.

As the material of the electrode layer 16, a platinum group element such as Pt, Au, Ni, or the like is used, for example. Alternatively, the electrode layer 16 may be constituted of a plurality of layers formed of these materials. Typically, the electrode layer 16 is constituted of three layers of Ti, Pt, and Au from the insulation layer 14 side. Ti has a function of enhancing an adhesion between Au or Pt and the insulation layer 14. Au has a function of preventing oxidation of the surface of the electrode layer 16.

The thickness of the electrode layer 16 is favorably 10 nm or more and 500 nm or less, more favorably 20 nm or more and 400 nm or less.

In the case where the electrode layer 16 is formed of Ti, Pt, and Au as described above, examples of the film thicknesses thereof become values as follows. Ti: 0.1 µm, Pt: 0.2 µm, Au: 0.05 µm. Of course, the respective film thicknesses are not limited to these values.

The light-emitting device 10 is manufactured by, for example, photolithography and an etching process using a resist as a mask. By this process, an interface between the electrode layer 16 and the insulation layer 14 can be formed with high accuracy.

The outer shape of the light-emitting device 10 is, for example, a rectangle when seen in the lamination direction of the respective layers (longitudinal direction in figure). The outer shapes of the insulation layer 14 and the electrode layer 16 are similarly a rectangle. These outer shapes are not limited to a rectangle and may be a polygon of a pentagon or more. Alternatively, the outer shapes may be a circle or an ellipse.

The width of the light-emitting device 10 is, for example, 5 µm or more and 300 µm or less. Specifically, in a case where the outer shapes of the light-emitting device 10, the insulation layer 14, and the electrode layer 16 are each a triangle or a rectangle, a length of one side of the light-emitting device 10 is set to be, for example, 5 µm or more and 300 µm or less. In a case where the light-emitting device 10 is rectangular, it may be a rectangle or a quadrate. In a case where the light-emitting device 10 is a rectangle, for example, a lower limit of a short side is 5 µm, and an upper limit of a long side is 300 µm.

In a case where the outer shape of the light-emitting device 10 is a polygon of a pentagon or more as described above, a length of a longest diagonal line (line connecting vertices of two points) is set to be 5 µm or more and 300 µm or less, and in a case where the outer shape is a circle or an ellipse, a length of the diameter or major axis is set to be 5 µm or more and 300 µm or less.

The width of the electrode layer 16 is set to be, for example, 4 µm or more and 200 µm or less. Specifically, in the case where the outer shape of the electrode layer 16 is a triangle or a rectangle, a length of one side thereof is set to be, for example, 4 µm or more and 200 µm or less (see FIG. 3C). In the case where the outer shape of the electrode layer 16 is a polygon of a pentagon or more, the length of the longest diagonal line is set within the range described above and is set to be 4 µm or more and 200 µm or less. In the case where the outer shape is a circle or an ellipse, the length of the diameter or major axis is set to be 4 µm or more and 200 µm or less.

For example, the length of one side, diagonal line, diameter, or major axis of the electrode layer 16 is set to be 10 to 190, 10 to 100, 10 to 50, 10 to 30, 10 to 20, 10 to 15, 5 to 100, 10 to 50, 5 to 15, 5 to 10, 5 to 9, 5 to 8, or 5 to 7 (unit is µm).

2. SUBSTRATE MODULE

Figure 4A:
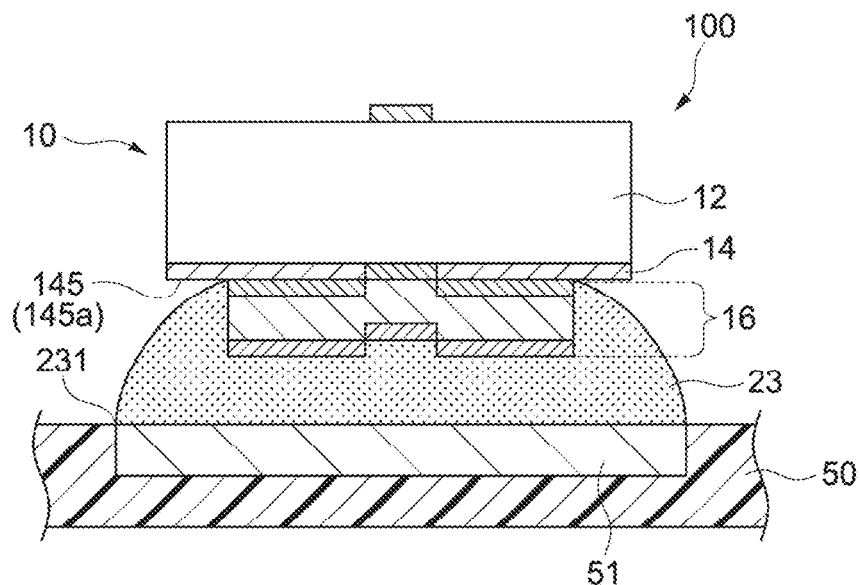
[FIGS. 4A and 4B]
Figure 4B:
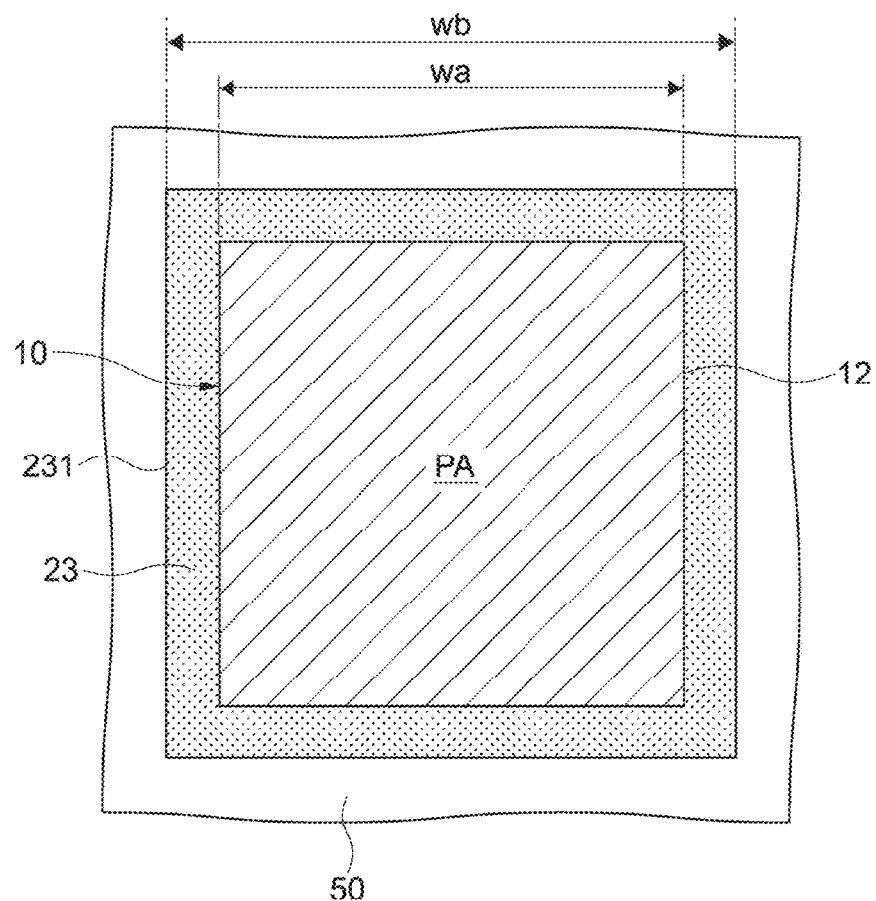

FIG. 4A is a cross-sectional diagram of a substrate module including the light-emitting device 10. FIG. 4B is a plan view thereof. A substrate module 100 includes a substrate (e.g., circuit substrate for mounting) 50, the light-emitting device 10 mounted on the substrate 50, and the metal bonding material for connecting them.

Glass or a resin is used as a main material of the substrate 50. The substrate 50 includes a substrate electrode layer 51 as a bonding layer. The electrode layer 16 of the light-emitting device 10 is connected to the substrate electrode layer 51 via a solder 23 as the metal bonding material. Since the wettability of the molten solder 23 with respect to the electrode layer 16 differs from that with respect to the insulation layer 14, the solder 23 is solidified and formed as shown in the figure. Specifically, since the insulation layer 14 has non-wettability and the electrode layer 16 has wettability, in a state where the solder 23 is solidified, the solder 23 is formed so as to come into contact with the entire bottom and side surfaces of the electrode layer 16 while avoiding contact with the insulation layer 14. In other words, the position of the surface of the solder 23 is determined such that the surface of the solder 23 is formed from the vicinity of a boundary between the insulation layer 14 and the electrode layer 16 on the bottom surface 145 of the insulation layer 14.

Further, as shown in FIG. 4B, a hatched rectangular component projection area PA obtained by projecting the light-emitting device 10 onto the substrate 50 is arranged on an inner side than an outer circumferential edge (outer circumferential edge of contact area of solder 23 that comes into contact with substrate electrode layer 51) 231 of the solder 23 in the solidified state. In particular, a ratio of a width wa of the component projection area PA and a width wb of the contact area of the solder 23 (wa:wb) is set to be 1:1.1 to 3, favorably 1:1.1 to 2.

In this embodiment, the width of the substrate electrode layer 51 (width in lateral direction in figure) and the width of the outer circumferential edge (outer circumferential edge of contact area) of the solder 23 coincide. However, the width of the substrate electrode layer 51 may be larger than the width of the outer circumferential edge of the solder 23. It should be noted that the term "width" used herein may also be defined in a manner similar to that of the definition of "width" described above.

By the configurations of the insulation layer 14 and electrode layer 16 of the light-emitting device 10 as described above, the side surfaces of the semiconductor layer 12 are not wetted by the solder 23 in the molten state, and an occurrence of a tilt of the light-emitting device 10 can be suppressed.

The width of the substrate electrode layer 51 is favorably set to be 115% or more and 300% or less, more favorably 130% or more and 200% or less the width of the light-emitting device 10 (semiconductor layer 12) in the same direction.

The width of the bottom surface of the solder 23 (i.e., width of contact area) is favorably set to be 115% or more and 300% or less, more favorably 130% or more and 200% or less the width of the light-emitting device 10 (semiconductor layer 12) in the same direction.

By designing the width of the substrate electrode layer 51 and the width of the bottom surface of the solder 23 as described above, self alignment (self-aligned positioning) of the light-emitting device 10 is positively performed as will be described later.

3. REFERENCE EXAMPLE, COMPARATIVE EXAMPLE

3.1) Problems of Light-Emitting Device (and Substrate Module) According to Reference Example Next, problems of a substrate module including a light-emitting device according to a reference example having a configuration different from that of the light-emitting device 10 as the component of the present technology will be described. FIG. 5A shows a substrate module in which a light-emitting device 110 according to the reference example is mounted on a substrate without a tilt. FIGS. 5B and 5C each show a substrate module in which the light-emitting device 110 according to the reference example is mounted on the substrate 50 with a tilt.

In order to perform centering of the light-emitting device 110 by a surface tension of a solder in a molten state (hereinafter referred to as molten solder) in a reflow process and suppress a tilt of the light-emitting device 110, for example, a sufficient amount of molten solder is required. This is for enabling the light-emitting device 110 on the molten solder to move a certain extent in a direction parallel to the mounting surface of the substrate 50 (upper surface of substrate electrode layer 51).

"Centering" refers to positioning at a center of a contact area (in this embodiment, coincides with upper surface area of substrate electrode layer 51). In the case of this embodiment, centering is performed by self alignment. "Tilt" means a tilt due to a rotation of the light-emitting device 110 about an axis parallel to the mounting surface of the substrate 50.

In a case where the light-emitting device includes a general configuration in which a plurality of electrodes are provided on a bottom surface thereof, parallelism between the plurality of electrodes and the solder can be maintained. This is because, in most of the general devices including a plurality of electrodes, it is mostly the case that those electrodes are positioned evenly on the bottom surface of the light-emitting device, and the plurality of electrodes become a base (leg) at the time of bonding. Therefore, it is easy to suppress a tilt of the light-emitting device including a plurality of electrodes on the bottom surface thereof.

However, in a case where a one-sided (bottom surface side) single electrode, that is, an electrode 36 provided physically integrally in a component such as a light-emitting device is provided, when an amount of the solder 23 is large, the light-emitting device 110 may fall toward a corner portion of the molten solder 23 due to its own weight to thus be tilted as shown in FIG. 5B. This makes the positioning difficult.

Alternatively, as shown in FIG. 5C, when layers having high wettability are provided as the respective layers of the light-emitting device 110 excluding the electrode 36, for example, there is a fear that the molten solder 23 will wettedly spread on the layers excluding the electrode 36, and also in this case, there is a fear that a tilt will be caused.

As described above, a difficulty level of the light-emitting device having a one-sided single electrode and that of the light-emitting device having a plurality of electrodes on one side differ, and the difficulty level of the light-emitting device having a single electrode increases remarkably. Therefore, some sort of ingenuity is required for the structure of the light-emitting device having a single electrode or the structure on the substrate 50 side.

In contrast, in the light-emitting device 10 according to the present technology, the wettability of the electrode layer 16 and that of the insulation layer 14 with respect to the solder 23 differ, and the electrode layer 16 protrudes downward from the insulation layer 14 such that the bottom surface 14S of the insulation layer 14 is exposed on an entire outer circumference side of the electrode layer 16 as shown in FIG. 4A. In other words, the electrode layer 16 and the insulation layer 14 have a so-called "rat guard" structure or an "overhang" structure. With such a configuration, since the bottom surface 14S of the insulation layer 14 stops the rise of wetting or rise of the solder 23, the contact angle of the solder 23 with respect to the electrode layer 16 is stabilized. Accordingly, the tilt of the light-emitting device 10 can be suppressed.

3.2) Comparative Example

Hereinafter, light-emitting devices according to several comparative examples, that have structures that are apt to tilt, will be described.

3.2.1) Comparative Example 1

Figure 6A:
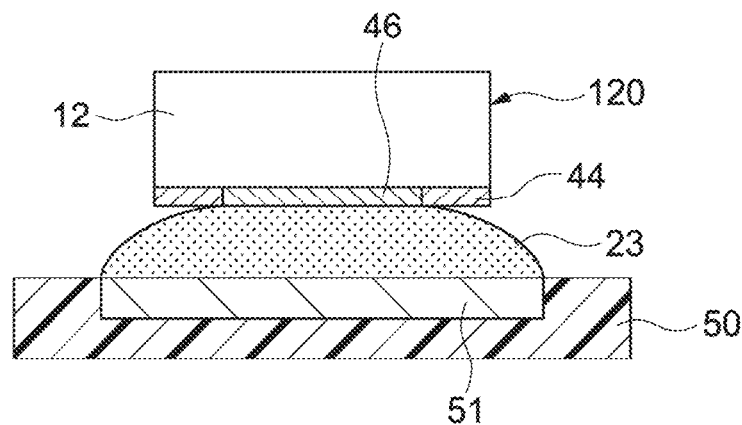
[FIGS. 6A, 6B, and 6C] FIGS. 6A, 6B, and 6C each show a substrate module according to Comparative Example 1.

FIG. 6A shows a substrate module according to Comparative Example 1. A light-emitting device 120 of the substrate module according to Comparative Example 1 is similar to the light-emitting device 10 according to the present technology in that an insulation layer 44 and an electrode layer 46 are provided below the semiconductor layer 12. However, the light-emitting device 10 and the light-emitting device 120 differ in that thicknesses of the insulation layer 44 and the electrode layer 46 are substantially the same, that is, bottom faces thereof are within substantially the same plane. Further, the component 20 and the light-emitting device 10 according to the present technology differ from the light-emitting device 120 according to Comparative Example 1 also in the point that, as shown in FIGS. 1A, 1B, 1C, 3A, 3B, and 3C, the first layer 24 includes the unexposed bottom surface area 24Sb covered by the second layer 26 in addition to the exposed area 24Sa out of the bottom surface 24S.

Figure 6B:
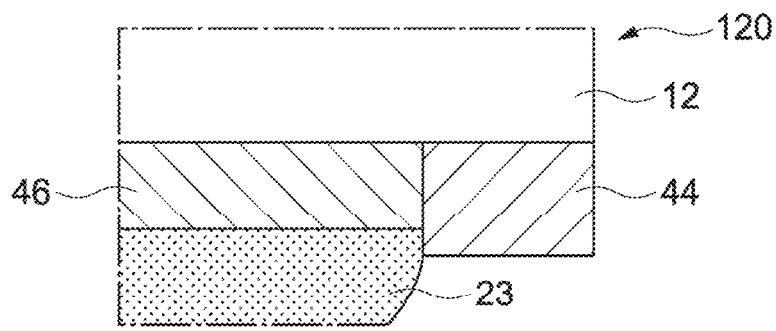
Figure 6C:
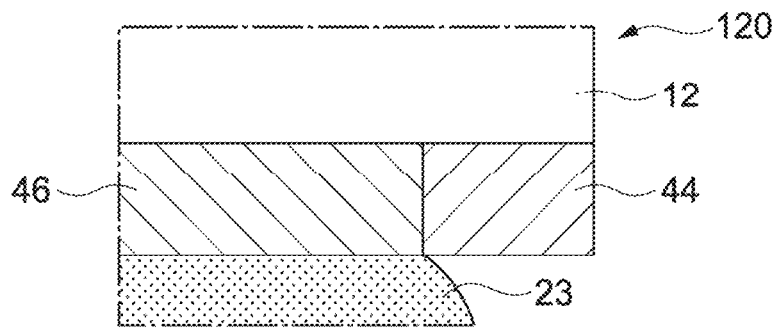

FIGS. 6B and 6C are each an enlarged diagram of a main part of the substrate module shown in FIG. 6A. As shown in FIGS. 6B and 6C, a slight difference in the electrode thickness caused by a manufacturing error of the light-emitting device 120 causes a difference in how a peripheral portion of the electrode is wetted. Specifically, there is a fear that the contact angle of the solder 23 with respect to the light-emitting device 120 will vary. FIG. 6B shows a configuration in which, for example, the thickness of the electrode layer 46 is slightly smaller than the thickness of the insulation layer 44, and FIG. 6C shows a configuration in which the thicknesses are the same. In this way, depending on the contact angle, the light-emitting device 10 is apt to tilt.

Figure 7:
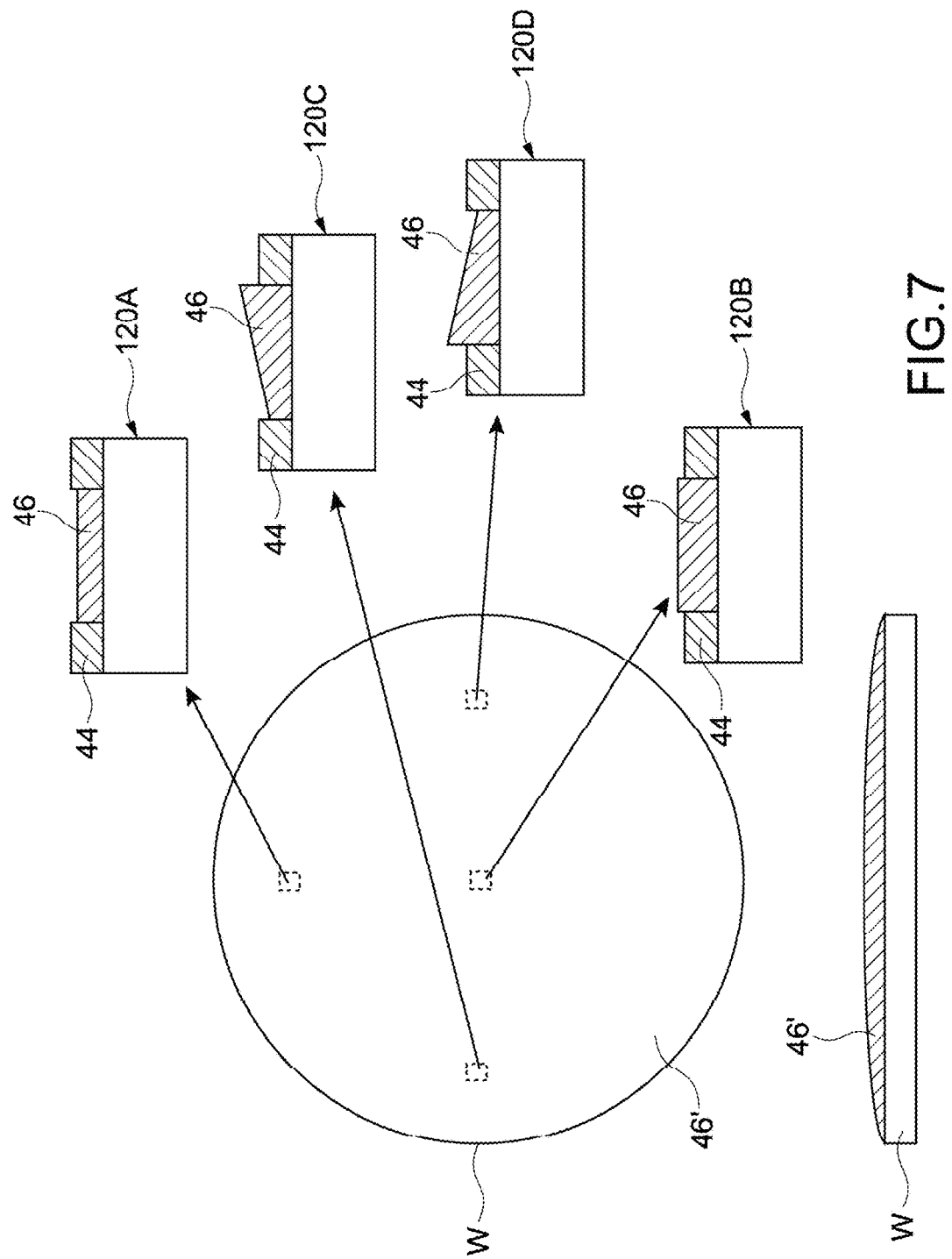
[FIG. 7]

FIG. 7 is a diagram for explaining a problem that occurs due to a film (electrode film) 46' of the electrode layer formed on a semiconductor wafer W not becoming uniform on a single semiconductor wafer in a process of manufacturing the light-emitting device 10 shown in FIG. 6A. Specifically, a film thickness of the electrode film 46' on the semiconductor wafer W tends to become thick at a center portion of the semiconductor wafer W and become thin at an edge portion. This is as has been described with reference to FIGS. 6B and 6C. In FIG. 7, light-emitting devices having different thicknesses of the electrode layer 46 are denoted by symbols 120A and 120B.

Further, the electrode films 46' having different tilts may be formed in accordance with an area of the semiconductor wafer W. If the electrode film 46' includes a tilt in this way, it becomes more difficult to suppress the tilt of the light-emitting device 10. In FIG. 7, light-emitting devices each including the electrode layer 46 having a tilt are denoted by symbols 120C and 120D.

3.2.2) Comparative Example 2

Figure 8A:
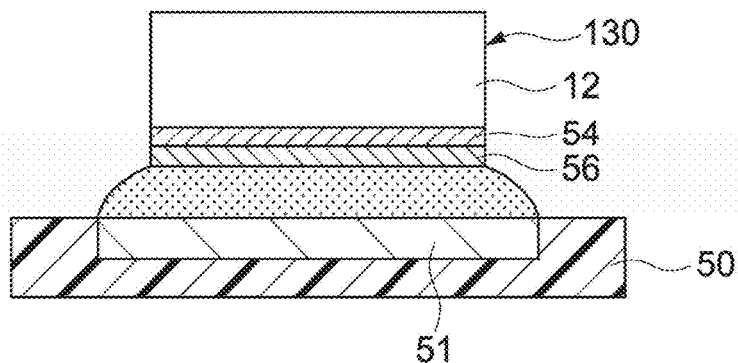
[FIGS. 8A, 8B, 8C, and 8D] FIGS. 8A, 8B, 8C, and 8D each show a substrate module according to Comparative Example 2.
Figure 8B:
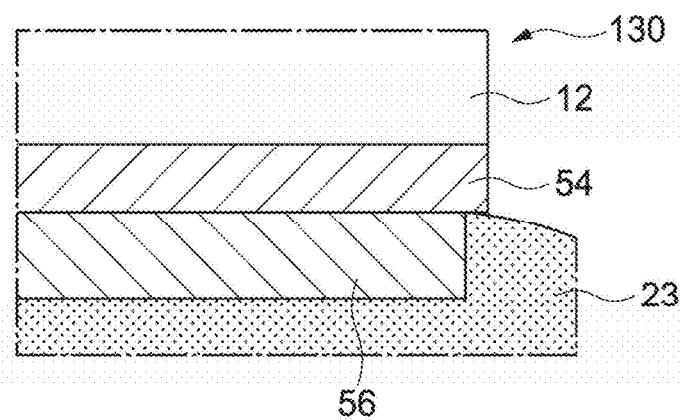
Figure 8C:
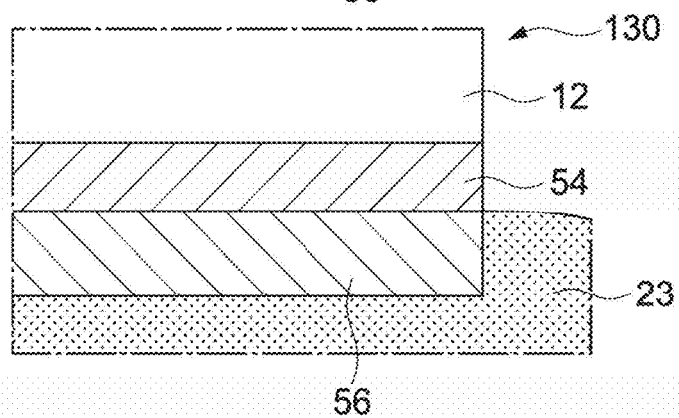
Figure 8D:
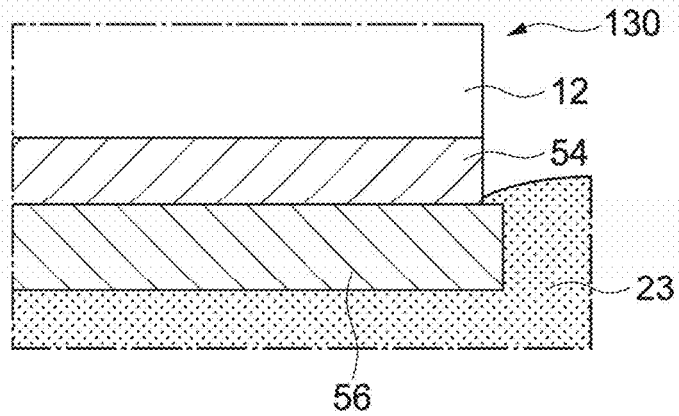

FIG. 8A shows a substrate module according to Comparative Example 2. The light-emitting element 10 of the substrate module according to Comparative Example 2 includes an insulation layer 54 and an electrode layer 56 having substantially the same area when seen in a lamination direction. FIGS. 8B, 8C, and 8D are each an enlarged diagram of a main portion of the substrate module shown in FIG. 8A.

As shown in FIGS. 8B, 8C and 8D, the width of the electrode layer 56 may differ from the width of the insulation layer 54 due to a manufacturing error. Since the insulation layer 54 according to these examples does not have a surface receiving structure (exposed bottom surface 145 of insulation layer 14 as shown in FIG. 3B) as in the present technology, the contact angle of the solder 23 with respect to the light-emitting device 130 tends to vary. Therefore, depending on the contact angle, a tilt tends to occur in the light-emitting device 130.

Figure 9:
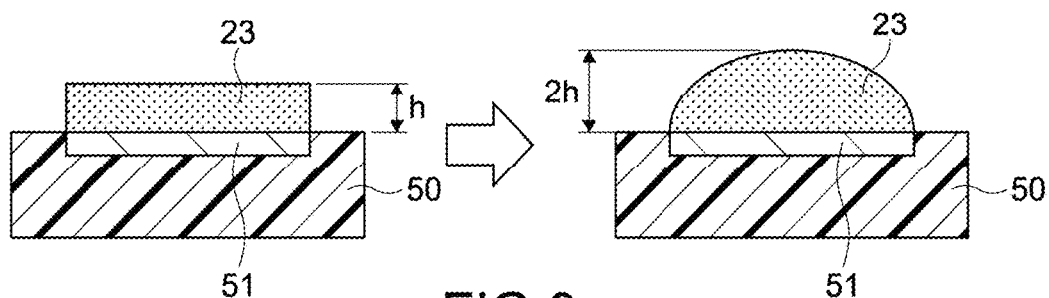
FIG. 9 is a diagram for explaining a behavior when a solder melts in a reflow process.

3.2.3) Advantages of Structure According to Present Technology from Viewpoint of Solder Behavior During Reflow FIG. 9 is a diagram for explaining a behavior when the solder 23 melts in a reflow process. A case where the solder 23 melts as shown in the right-hand figure from a state where the solder 23 is solidified as shown in the left-hand figure in FIG. 9 will be discussed. As a soldering temperature reaches a melting point, the solder 23 melts instantaneously and becomes a dome shape in which a height (thickness) thereof is twice or more. For example, h=3 μm and 2 h=6 μm in the figure. After that, in about 15 seconds, the solder 23 is solidified as a reflow temperature decreases.

Figure 10:
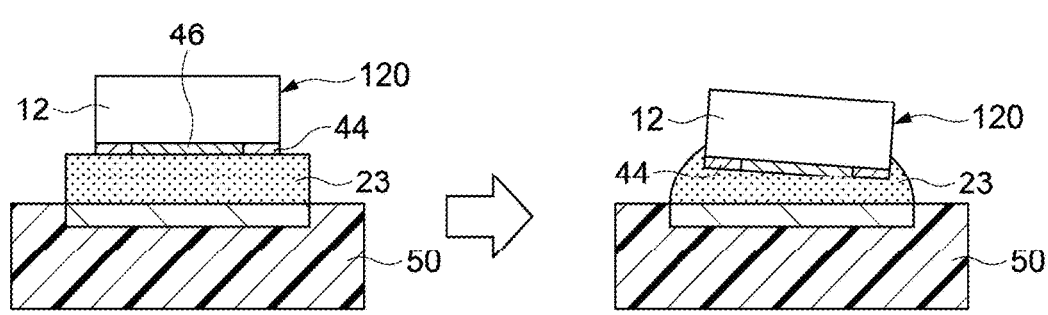
[FIG. 10]

FIG. 10 shows a state where the light-emitting device 120 according to Comparative Example 1 above is bonded to the substrate 50 by reflow of the solder 23. As shown in the figure, when the width of the solder 23 (width in direction parallel to mounting surface of substrate 50) is larger than the width of the light-emitting device 120, the molten solder 23 pushes up the light-emitting device 120 at once so as to become a dome shape as shown in the left-hand figure. As a result, the molten solder 23 passes the side surfaces of the insulation layer 44 and wettedly spreads to the side surfaces of the semiconductor layer 12. Consequently, the light-emitting device 120 is highly likely to tilt.

Figure 11:
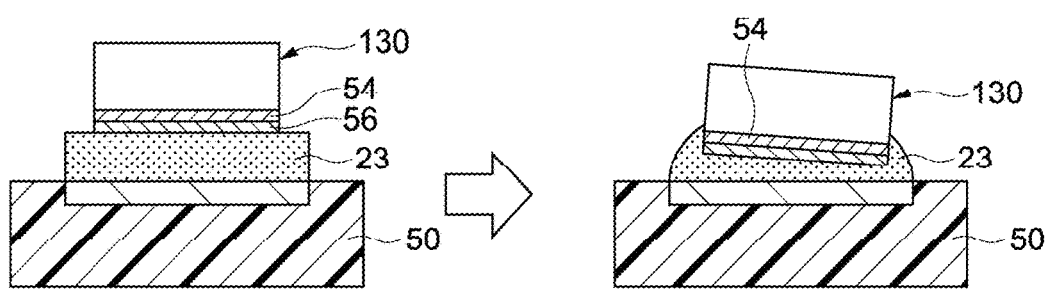
[FIG. 11]

FIG. 11 shows a state where the light-emitting device 130 according to Comparative Example 2 is bonded to the substrate 50 by reflow of the solder 23 similarly to FIG. 10. A bonding operation in this case also shows a behavior similar to that of the case shown in FIG. 10, and a possibility of the light-emitting device 130 being tilted becomes high.

Figure 12:
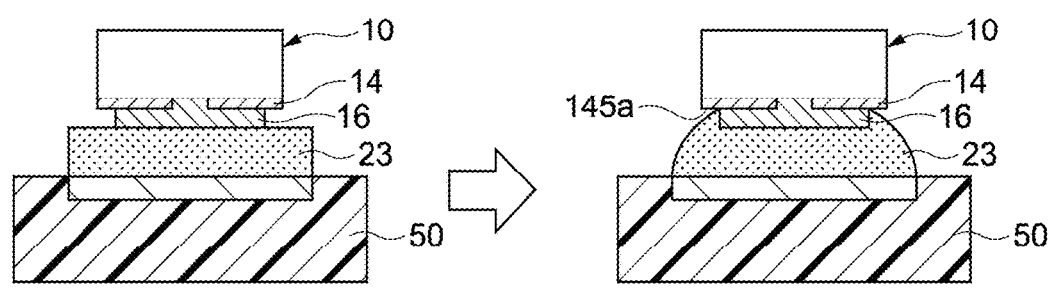
[FIG. 12]

FIG. 12 shows a state where the light-emitting device 10 according to the present technology is bonded to the substrate 50 by reflow of the solder 23. When the solder 23 is in a solidified state, the solder 23 and the insulation layer 14 are set apart from each other. As the solder 23 melts, the molten solder 23 rising up to the electrode layer 16 having high wettability is received by the exposed area 145a on the entire outer circumference side of the electrode layer 16. In this way, the insulation layer 14 can stop the molten solder 23. Accordingly, the light-emitting device 10 can maintain a horizontal state without tilting.

4. REGARDING THICKNESS OF AU LAYER OF ELECTRODE LAYER

Particularly in a case where a minute light-emitting device 10 having a width of 5 μm or more and 300 μm or less (length of one side in the case of a rectangle) is used, the light-emitting device is extremely light. Therefore, if the wettability with respect to the solder as the metal bonding material is lowered even slightly (e.g., thickness of Au in electrode layer 16 becomes thin), solder bonding becomes difficult. For example, in a case where a plurality of light-emitting devices that are continuously coupled on a semiconductor wafer are subjected to separation etching for each light-emitting device in a manufacturing process, the electrode layer is etched and becomes thin when the electrode is used as a mask. For example, in a case where Au is used in a lowermost layer (layer closest to substrate side) of the electrode layer, Au may be totally removed by etching. In this case, solder bonding becomes difficult as described above. Further, a situation where Au peeled off by the etching adheres onto the side surfaces of the insulation layer or the side surfaces of the semiconductor is also conceivable. In this case, there is a fear that in the solder reflow process, the molten solder will wettedly spread along that Au to reach the side faces of the semiconductor. In this case, as described above, there is a possibility that the light-emitting device will tilt with respect to the substrate. As a result, there is a fear that a yield will be lowered.

On the other hand, if Au is made excessively thick so as to provide high wettability with respect to a solder to the electrode layer 16, Au diffuses into the solder (Sn), and a fragile AuSn alloy IMC (Inner Metallic Compound) having poor fluidity grows. Specifically, a bridge (or pillar) formed of an AuSn alloy is formed between Au of the electrode layer and the substrate electrode layer in the solder as Sn. If the bridge is formed in the solder in this way, a movement of the light-emitting device is hindered in the reflow process, and self alignment becomes difficult.

Figure 13:
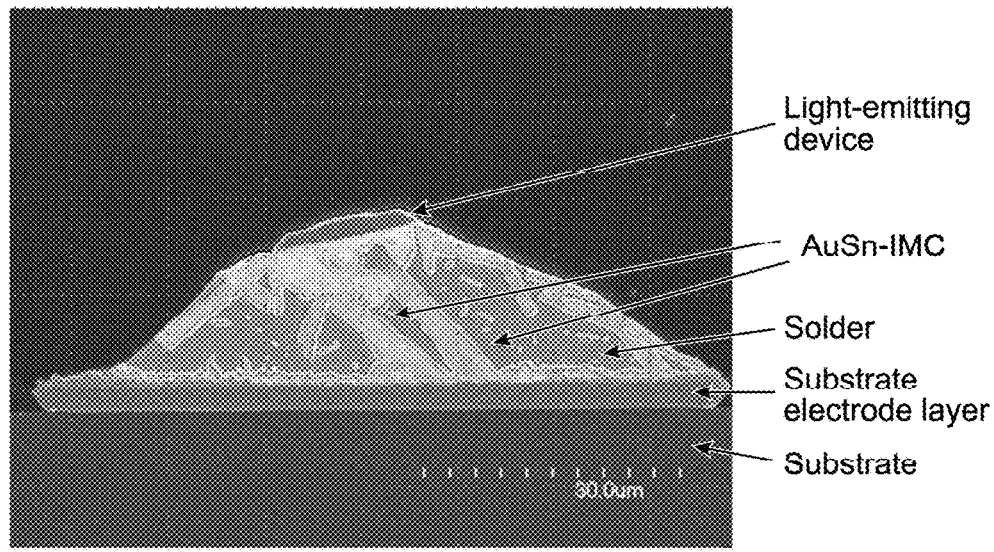
[FIG. 13]

FIG. 13 is a photomicrograph of a substrate module including a solder in which such an AuSn-IMC bridge is formed. As can be seen from this photograph, when the Au thickness is too large, a bridge formed of an AuSn alloy is formed excessively, and the light-emitting device may be fixed in a tilted state. As a result of studies by the inventors, it was found that an upper limit of the Au thickness not affected by the adverse influence described above is 3% or less the solder in a weight ratio.

From the descriptions above, in the case of manufacturing the minute light-emitting device 10, that is, the light-emitting device 10 having a width of 5 µm or more and 300 µm or less, the thickness of the Au layer for preventing oxidation of the electrode layer 16 is set to be 10 nm or more and 100 nm or less, favorably 20 nm or more and 80 nm or less, more favorably 30 nm or more and 70 nm or less or 40 nm or more and 60 nm or less, and is typically about 50 nm.

In addition, from the descriptions above, it is favorable to use a process that uses photolithography instead of a process of separating a plurality of light-emitting devices continuously coupled on a semiconductor wafer by separation etching. In other words, by using a resist as a mask, the problem that the electrode material adheres onto the side surfaces of the insulation layer or the side surfaces of the semiconductor when the electrode is used as a mask is solved.

5. REGARDING THICKNESS OF METAL BONDING MATERIAL (SOLDER)

According to the verifications by the present inventors, when the thickness of the solder becomes smaller than about 2 µm, self alignment of the light-emitting device cannot be performed due to the AuSn-IMC described above. This similarly applies to a case where the solder is formed of a SnAg-based material or a SnAgCu-based material. As the reason thereof, the reflow temperature is concerned. In a case of performing the reflow process with a Sn-based solder, substantially similar conditions are used for a temperature profile.

Figure 14:
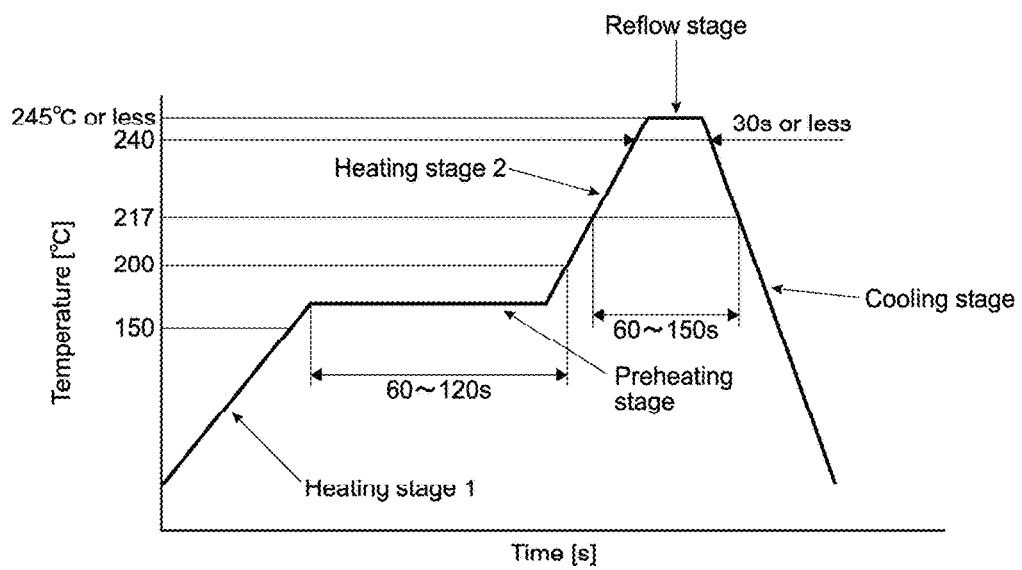
[FIG. 14]

FIG. 14 is a graph showing an example of the temperature profile of the reflow process using the Sn-based solder. The solder melts at a highest temperature, for example, around 245° C. When the solder melts under such a condition, thin Au formed on the electrode layer of the light-emitting device or the surface of the substrate electrode layer diffuses into the molten solder, and thus the AuSn-IMC is diffused. A diffusion depth is approximately 2 µm. In other words, for the light-emitting device 10 according to the present technology to be self-aligned and become horizontal, it is desirable for the solder thickness to be 2 µm or more.

It should be noted that the temperature profile shown in FIG. 14 is a mere example, and the present technology can adopt other temperature profiles.

Figure 15:
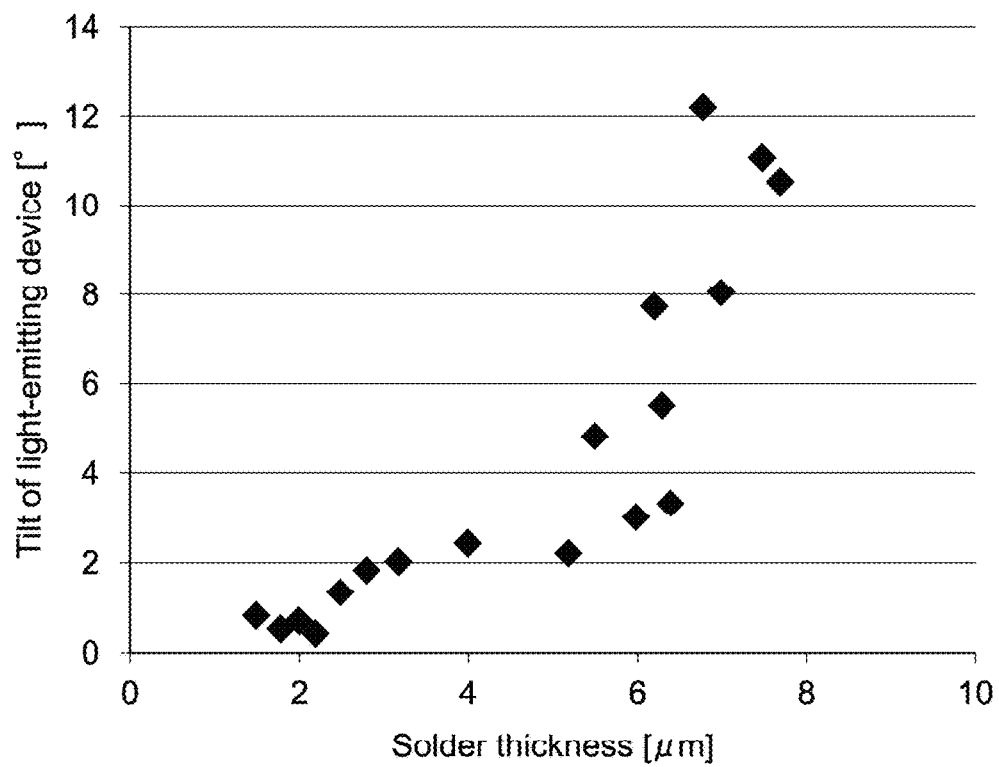
[FIG. 15]

Meanwhile, if the solder becomes excessively thick, the tilt increases. FIG. 15 is a graph showing an actual measurement of a relationship between the thickness of the solder 23 and the tilt of the light-emitting device 10. In this experiment, the length (i.e., width) of one side of the rectangular electrode layer 16 in the light-emitting device 10 having a rectangular outer shape was set to 13 µm. As shown in FIGS. 3A, 3B, and 3C, the electrode layer 16 was formed of Ti, Pt, and Au, and thicknesses thereof were 0.1 µm, 0.2 µm, and 0.05 µm, respectively.

As can be seen from the graph, when the solder thickness becomes larger than about half the width of the electrode layer 16, there is a fear that the tilt of the light-emitting device 10 will increase and a posture will become unstable. This can be explained as a phenomenon that the light-emitting device 10 is apt to slip off as a curvature of a surface of the molten solder increases (see FIG. 3B). Therefore, it can be said that it is favorable for the solder thickness to be half the width of the electrode layer 16 or less (in this example, 6.5 µm or less).

From the descriptions above, it can be said that in the present technology, it is desirable to satisfy the following conditions in order to suppress the tilt of the light-emitting device 10.

(1) Of the electrode layer 16, a volume of Au provided in the surface layer of the electrode layer 16 is 3% or less the volume of the solder 23.

(2) The thickness of the Sn-based solder (solidified state) is 2 µm or more and is ½ or less the width of one side of the electrode layer 16 of the light-emitting device 10.

Figure 16:
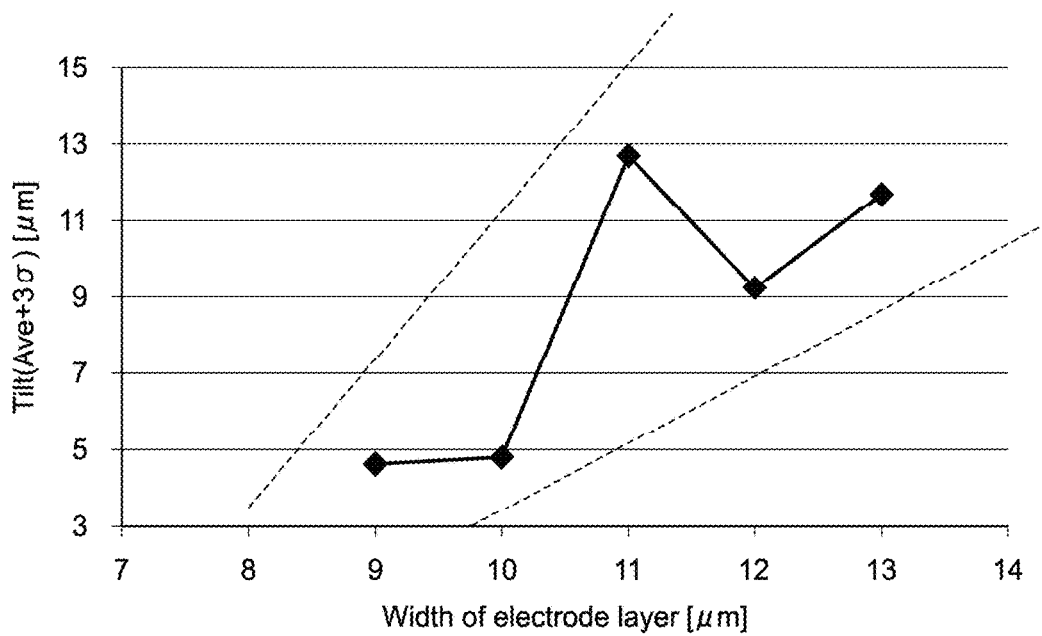
[FIG. 16]

As described above, a prerequisite for suppressing the tilt of the component 20 (light-emitting device 10) is to provide the second layer 26 that protrudes from the bottom surface 245 side of the first layer 24 such that the bottom surface 245 (145) of the first layer 24 (insulation layer 14) is exposed on an entire outer circumference side of the second layer 26 (electrode layer 16) as described above. FIG. 16 is a graph showing a result of this verification and shows a relationship between the width of the electrode layer 16 (length of one side in the case of a rectangle) and the actual tilt.

In this experiment, the width of the rectangular light-emitting device 10 and the width of the insulation layer 14 were fixed at 15 µm, and the width of the electrode layer 16 was changed. From the experimental results shown in FIG. 16, an effect due to the unique structure described above according to the present technology was confirmed although the effect was somewhat unstable. Specifically, it was confirmed that since the exposed area 145a of the bottom surface 145 of the insulation layer 14 becomes smaller as the width of the electrode layer 16 increases in a range that is equal to or larger than a predetermined width (9 µm in experiment), the tilt tends to become larger.

6. COMPONENT OR SUBSTRATE MODULE ACCORDING TO OTHER EMBODIMENTS

6.1) Embodiment 1

Figure 17:
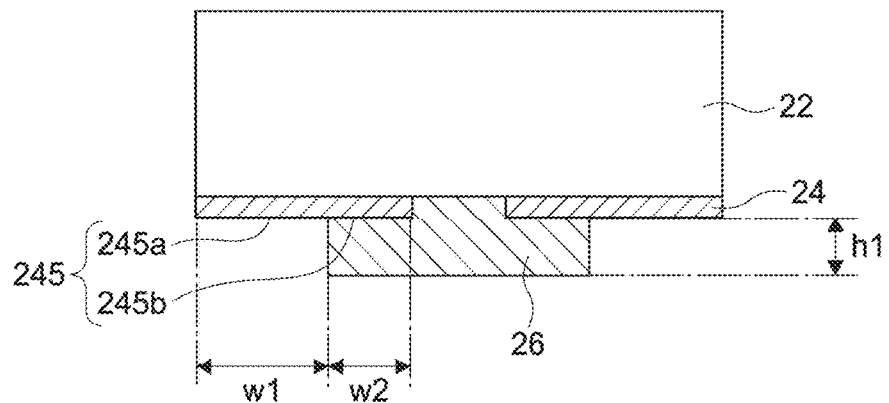
[FIG. 17]

FIG. 17 is a cross-sectional diagram of a component according to another Embodiment 1. As can be seen from this cross-sectional diagram, a width (first width) w1 of the area 245a exposed on the entire outer circumference side of the second layer 26 (hereinafter, referred to as exposed bottom surface area) out of the bottom surface 245 of the first layer is configured to be larger than a width w2 of the unexposed bottom surface area 245b in the same direction.

The exposed bottom surface area 245a of the first layer 24 has a rectangular opening pattern shape in a plan view. Alignment accuracy during exposure, for example, for forming this opening pattern by photolithography is higher than the alignment accuracy of an apparatus that mounts this component on a substrate. According to the configuration shown in FIG. 17, a deviation margin (allowable deviation range) of an exposure apparatus having high positioning accuracy is set to be smaller than a deviation margin of a mounting apparatus having lower alignment accuracy than that. In other words, there is an advantage that the deviation margin of the mounting apparatus having low accuracy is expanded.

6.2) Embodiment 2

Reference will be made to FIG. 17 as a cross-sectional diagram of a component according to another Embodiment 2. In this cross-sectional diagram, the width w1 of the exposed bottom surface area 245a is larger than a protrusion height h1 of the second layer 26 protruding from the bottom surface of the first layer 24 in a protrusion direction. By setting the width w1 of the exposed bottom surface area, which is less likely to be wetted by the metal bonding material, to be larger than the protrusion height h1 of the second layer 26, which is highly likely to be wetted by the metal bonding material, in this way, it is possible to further reduce the possibility of the side surfaces of the main body 22 being wetted by the metal bonding material.

6.3) Embodiment 3

Figure 18A:
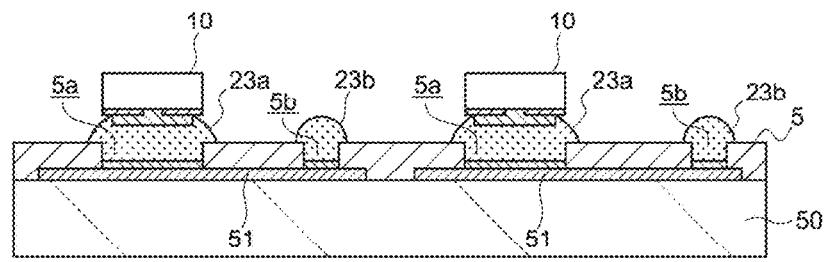
[FIGS. 18A and 18B]
Figure 18B:
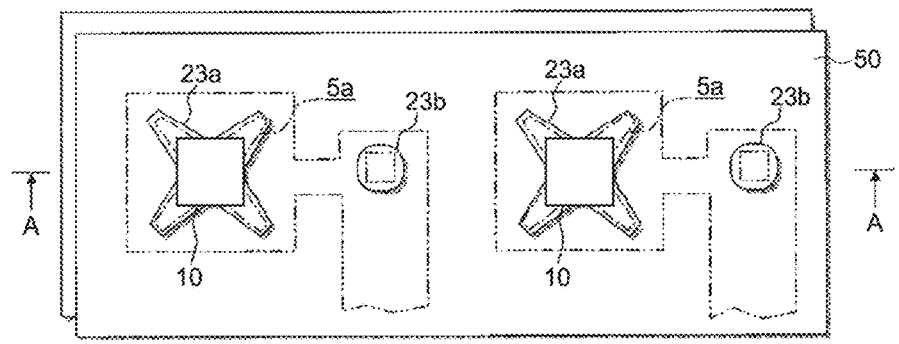

FIG. 18B is a plan view of a substrate module according to another Embodiment 3, and FIG. 18A is a cross-sectional diagram taken along the line A-A of FIG. 18B. This substrate module includes the substrate 50, an insulation film (film) 5 including openings 5a and 5b, the substrate electrode layer (bonding layer) 51, solder patterns (metal bonding materials) 23a and 23b, and the light-emitting devices 10. The light-emitting devices 10 and the substrate electrode layer 51 are connected by the solder patterns 23a and 23b provided in the openings 5a.

As shown in FIG. 18B, an opening shape of the opening 5a of the insulation film 5 includes protrusions (e.g., 4 protrusions) that protrude radially from a center portion of that opening 5a. The solder pattern 23a has substantially the same planar shape as the opening shape of the opening 5a at the opening 5a of the insulation film 5. The light-emitting device 10 is fixed to an area corresponding to the center portion of that opening 5a.

Specifically, as described above, the bottom surface of the light-emitting device 10 has a shape of a polygon of a triangle or more, a circle, an ellipse, or the like, and is a rectangle in FIGS. 18A and 18B. The protrusions of the opening 5a are arranged while being substantially equiangular with respect to one another in at least 3 directions rotationally symmetric from the center portion, tip ends of which are arranged on a circumference centered on the center portion, and each have a shape that becomes thinner toward the tip end. Substantially equal angles also include an angular error range within a range where the protrusions can effectively position the device.

For example, 3 to 6 protrusions or more are provided. In FIG. 18B, there are 4 protrusions.

According to such a substrate module, the light-emitting device 10 is positively self-aligned at the center portion of the opening 5a in the reflow process of the solder pattern 23a.

7. VARIOUS OTHER EMBODIMENTS

The present technology is not limited to the embodiments described above, and various other embodiments can be realized.

Figure 19:
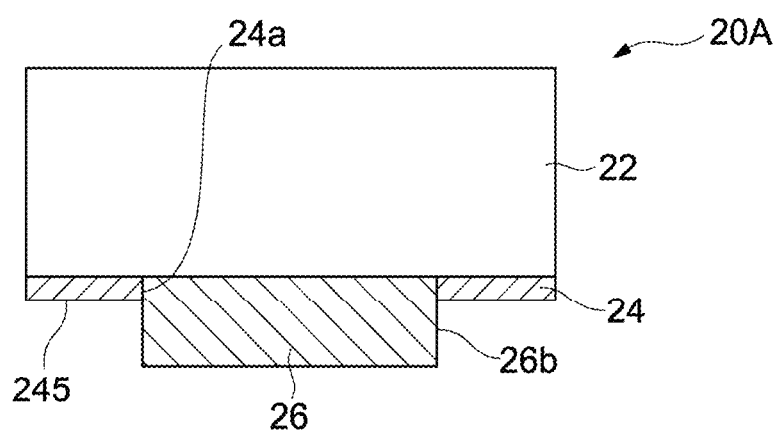
FIG. 19 is a cross-sectional diagram showing a component according to further another embodiment of the present technology.

A configuration in which the bottom surface 245 is fully exposed as in a configuration of a component 20A shown in FIG. 19, for example, is also included in the range of the present technology as the configuration in which the second layer 26 protrudes from the bottom surface 245 side of the first layer 24. In other words, in this configuration, the second layer 26 protrudes from the bottom surface side of the first layer 24 so that a side surface 26b on an outer circumference of the second layer 26 protrudes from the opening 24a of the first layer 24.

Although the light-emitting device 10 is exemplified as the component 20 according to the embodiment described above (see FIGS. 1A, 1B, and 1C), the present technology may also be applied to, for example, a component configuring an optical filter. In this case, for example, a main body of a plurality of components may configure a mirror or a translucent portion. An optical filter such as a color filter and a polarization filter can be realized by arranging the plurality of components on a substrate in a matrix or in a staggered arrangement. The main body of the component is not limited to the semiconductor layer 12 and may be formed of metal or a resin. A transparent resin may be used as the resin. In addition, the first layer 24 is not limited to a material including an electric insulation function, and the second layer 26 is not limited to a material including a conductive function. Further, as the metal bonding material, metal other than a solder may be adopted.

As an apparatus that uses the light-emitting device 10, there are a display apparatus, a scanner, a printer, and the like. In a case where the light-emitting device 10 is used in a display apparatus, the light-emitting devices 10 are arranged on a substrate such that the individual light-emitting devices 10 respectively correspond to individual pixels. In a case where the plurality of light-emitting devices 10 are used in a scanner, a printer, and the like, the devices are used as light sources for irradiating reading light and photosensitive light.

At least two of the feature portions according to the embodiments described above can be combined.

It should be noted that the present technology can also take the following configurations.

(1) A component, including:
  a main body including a bottom surface;
  a first layer that is provided on the bottom surface of the main body and includes a bottom surface; and
  a second layer that is bonded to a metal bonding material on a substrate to be provided physically integrally, has higher wettability with respect to the metal bonding material in a molten state than the first layer, and protrudes from the bottom surface side of the first layer such that at least a part of the bottom surface of the first layer is exposed on an entire outer circumference side of the second layer.

(2) The component according to (1), in which
  the first layer is configured to have non-wettability with respect to the metal bonding material.

(3) The component according to (1) or (2), in which
  the first layer includes an unexposed bottom surface area covered by the second layer in addition to the exposed bottom surface area.

(4) The component according to (3), in which
  regarding the bottom surface of the first layer when seen in a cross section in a lamination direction of the first layer and the second layer,
  the exposed bottom surface area out of the bottom surface of the first layer includes a first width, and
  the unexposed bottom surface area includes a second width smaller than the first width.

(5) The component according to (3) or (4), in which
  regarding the bottom surface of the first layer when seen in a cross section in a lamination direction of the first layer and the second layer,
  a width of the exposed bottom surface area out of the bottom surface of the first layer is larger than a protrusion height of the second layer from the bottom surface of the first layer in a protrusion direction.

(6) The component according to (1), in which
  the main body includes a semiconductor material as a main constituent material,
  the first layer is formed of an insulating material, and
  the second layer is an electrode.

(7) The component according to (6), in which
the first layer is configured to have non-wettability with respect to the metal bonding material.
(8) The component according to (7), in which
the first layer includes SiO2, SiN, or a poly-based resin.
(9) The component according to any one of (6) to (8), in which
at least a bottom surface layer of the second layer is formed of the Au.
(10) The component according to (9), in which
a volume of the Au occupying the second layer is 3% or less a volume of the metal bonding material.
(11) The component according to any one of (6) to (10), in which
the second layer includes Pt or Ni.
(12) A substrate module, including:
a component;
a substrate including a bonding layer; and
a metal bonding material that connects the component to the bonding layer of the substrate,
the component including
a main body including a bottom surface,
a first layer that is provided on the bottom surface of the main body and includes a bottom surface, and
a single second layer that is bonded to a metal bonding material on a substrate to be provided physically integrally, has higher wettability with respect to the metal bonding material in a molten state than the first layer, and protrudes from the bottom surface side of the first layer such that at least a part of the bottom surface of the first layer is exposed on an entire outer circumference side of the second layer.
(13) The substrate module according to (12), in which
a component projection area obtained by projecting the component onto the substrate is arranged on an inner side than an outer circumferential edge of a contact area where the bonding layer and the metal bonding material come into contact with each other.
(14) The substrate module according to (12), further including
a film that includes an opening opposing the bonding layer, an opening shape of the opening including protrusions that protrude radially from a center portion,
in which
the metal bonding material includes a planar shape that is provided at the opening of the film and is substantially same as the opening shape of the opening,
the component is fixed to an area corresponding to the center portion of the metal bonding material,
the protrusions at the opening of the film are arranged to be substantially equiangular with respect to one another in at least 3 directions while being rotationally symmetric from the center portion, and each have a shape in which a tip end thereof is arranged on a circumference about the center portion and the protrusion becomes thinner toward the tip end, and
the metal bonding material provided inside the opening of the film and the bonding layer are connected to each other.
(15) The substrate module according to any one of (12) to (14), in which
a thickness of the metal bonding material is 2 μm or more and ½ or less a width of the second layer of the component.
(16) An apparatus, including:
a component;
a substrate including a bonding layer; and
a metal bonding material that connects the component to the bonding layer of the substrate,
the component including
a main body including a bottom surface,
a first layer that is provided on the bottom surface of the main body and includes a bottom surface, and
a single second layer that is bonded to a metal bonding material on a substrate to be provided physically integrally, has higher wettability with respect to the metal bonding material in a molten state than the first layer, and protrudes from the bottom surface side of the first layer such that at least a part of the bottom surface of the first layer is exposed on an entire outer circumference side of the second layer.
(17) An optical filter, including:
a component;
a substrate including a bonding layer; and
a metal bonding material that connects the component to the bonding layer of the substrate,
the component including
a main body including a bottom surface,
a first layer that is provided on the bottom surface of the main body and includes a bottom surface, and
a single second layer that is bonded to a metal bonding material on a substrate to be provided physically integrally, has higher wettability with respect to the metal bonding material in a molten state than the first layer, and protrudes from the bottom surface side of the first layer such that at least a part of the bottom surface of the first layer is exposed on an entire outer circumference side of the second layer.

REFERENCE SIGNS LIST 5 insulation film
5a opening
10 light-emitting device
12 semiconductor layer
14 insulation layer
16 electrode layer
20, 20A component
22 main body
23a solder pattern
23 solder
24 first layer
26 second layer
50 substrate
51 substrate electrode layer (bonding layer)
100 substrate module
145, 245 bottom surface
145a, 245a exposed area of bottom surface (exposed bottom surface area)
145b, 245b unexposed bottom surface area

The invention claimed is:
1. A component, comprising:
a main body including a bottom surface;
a first layer on the bottom surface of the main body, wherein
the first layer includes a bottom surface and an exposed bottom surface area, and
the exposed bottom surface area has a first width; and
a second layer bonded to a metal bonding material, wherein
the metal bonding material is between the second layer and a substrate,
wettability with respect to the metal bonding material in a molten state is higher for the second layer than the first layer, the second layer protrudes from the bottom surface of the first layer, at least a part of the bottom surface of the first layer is in contact with an entire outer peripheral side of the second layer, and in a cross-sectional view of the component along a lamination direction of the first layer and the second layer:

the first width of the exposed bottom surface area of the first layer is larger than a protrusion height of the second layer from the first layer in a protrusion direction.

2. The component according to claim 1, wherein the first layer has non-wettability with respect to the metal bonding material.

3. The component according to claim 1, wherein the first layer further includes an unexposed bottom surface area covered by the second layer.

4. The component according to claim 3, wherein the unexposed bottom surface area has a second width, and
the second width is smaller than the first width.

5. The component according to claim 1, wherein the main body includes a semiconductor material as a main constituent material,
the first layer comprises of an insulating material, and
the second layer is an electrode.

6. The component according to claim 5, wherein the first layer further includes one of $SiO_2$, SiN, or a poly-based resin.

7. The component according to claim 5, wherein at least a bottom surface layer of the second layer comprises Au.

8. The component according to claim 7, wherein a volume of the Au that occupies the second layer is one of 3% of a volume of the metal bonding material or less than 3% of the volume of the metal bonding material.

9. The component according to claim 5, wherein the second layer includes one of Pt or Ni.

10. A substrate module, comprising:
a component;
a substrate including a bonding layer; and
a metal bonding material that connects the component to the bonding layer of the substrate,
the component including
a main body including a bottom surface,
a first layer on the bottom surface of the main body, wherein
the first layer includes a bottom surface and an exposed bottom surface area, and
the exposed bottom surface area has a first width, and
a single second layer that is bonded to a metal bonding material, wherein
the metal bonding material is between the single second layer and a substrate,
wettability with respect to the metal bonding material in a molten state is higher for the single second layer than the first layer,
the single second layer protrudes from the bottom surface of the first layer,
at least a part of the bottom surface of the first layer is in contact with an entire outer peripheral side of the single second layer, and
in a cross-sectional view of the component along a lamination direction of the first layer and the single second layer:

the first width of the exposed bottom surface area of the first layer is larger than a protrusion height of the single second layer from the first layer in a protrusion direction.

11. The substrate module according to claim 10, wherein a component projection area is obtained based on projection of the component onto the substrate such that the bonding layer contacts the metal bonding material to form a contact area,
the contact area has an inner side and an outer circumferential edge, and
the component projection area is arranged on the inner side of the contact area.

12. The substrate module according to claim 10, further comprising
a film that includes an opening opposite to the bonding layer,
an opening shape of the opening includes a plurality of protrusions that protrude radially from a center portion of the metal bonding material,
wherein
the metal bonding material has a planar shape at the opening of the film and the planar shape is substantially same as the opening shape of the opening,
the component is fixed to an area corresponding to the center portion of the metal bonding material,
the plurality of protrusions at the opening of the film are substantially equiangular in at least 3 directions and are rotationally symmetric from the center portion of the metal bonding material,
each of the plurality of protrusions have a shape in which a respective tip end is on an outer peripheral region of the metal bonding material and a thickness of each of the plurality of protrusions decreases towards the respective tip end, and
the metal bonding material present inside the opening of the film is connected to the bonding layer.

13. The substrate module according to claim 10, wherein a thickness of the metal bonding material is one of 2 μm or more and half of a width of the single second layer or less than half of the width of the single second layer.

14. An apparatus, comprising:
a component;
a substrate including a bonding layer; and
a metal bonding material that connects the component to the bonding layer of the substrate,
the component including
a main body including a bottom surface,
a first layer on the bottom surface of the main body wherein
the first layer includes a bottom surface and an exposed bottom surface area, and
the exposed bottom surface area has a first width, and
a single second layer bonded to a metal bonding material, wherein
the metal bonding material is between the single second layer and a substrate,
wettability with respect to the metal bonding material in a molten state is higher for the single second layer than the first layer,
the single second layer protrudes from the bottom surface of the first layer,
at least a part of the bottom surface of the first layer is in contact with an entire outer peripheral side of the single second layer, and in a cross-sectional view of the component along a lamination direction of the first layer and the single second layer:

the first width of the exposed bottom surface area of the first layer is larger than a protrusion height of the single second layer from the first layer in a protrusion direction.

15. An optical filter, comprising:

a component;

a substrate including a bonding layer; and a metal bonding material that connects the component to the bonding layer of the substrate, the component including a main body including a bottom surface, a first layer on the bottom surface of the main body, wherein the first layer includes a bottom surface and an exposed bottom surface area, and the exposed bottom surface area has a first width, and a single second layer bonded to a metal bonding material, wherein the metal bonding material is between the single second layer and a substrate, wettability with respect to the metal bonding material in a molten state is higher for the single second layer than the first layer, the single second layer protrudes from the bottom surface of the first layer, at least a part of the bottom surface of the first layer is in contact with an entire outer peripheral side of the single second layer, and in a cross-sectional view of the component along a lamination direction of the first layer and the single second layer:

the first width of the exposed bottom surface area of the first layer is larger than a protrusion height of the single second layer from the first layer in a protrusion direction.

* * * * *